United States Patent
Marten

(10) Patent No.: US 9,470,724 B2
(45) Date of Patent: Oct. 18, 2016

(54) ATTACHMENT OF LEADS HAVING LOW THERMOELECTRIC ERRORS

(71) Applicant: Sendyne Corporation, New York, NY (US)

(72) Inventor: Victor Marten, Flushing, NY (US)

(73) Assignee: Sendyne Corporation, New York, NY (US)

( * ) Notice: Subject to any disclaimer, the term of this patent is extended or adjusted under 35 U.S.C. 154(b) by 0 days.

(21) Appl. No.: 14/893,040

(22) PCT Filed: Aug. 12, 2015

(86) PCT No.: PCT/IB2015/056133
§ 371 (c)(1),
(2) Date: Nov. 20, 2015

(87) PCT Pub. No.: WO2016/030788
PCT Pub. Date: Mar. 3, 2016

(65) Prior Publication Data
US 2016/0245848 A1     Aug. 25, 2016

Related U.S. Application Data

(60) Provisional application No. 62/042,787, filed on Aug. 27, 2014.

(51) Int. Cl.
*G01R 19/32* (2006.01)
*G01R 15/14* (2006.01)
*G01R 1/20* (2006.01)
*G01R 11/185* (2006.01)
*G01R 19/00* (2006.01)
(Continued)

(52) U.S. Cl.
CPC ............. *G01R 19/32* (2013.01); *G01R 1/203* (2013.01); *G01R 11/185* (2013.01); *G01R 15/14* (2013.01); *G01R 19/00* (2013.01); *G01R 31/00* (2013.01); *G01R 11/02* (2013.01)

(58) Field of Classification Search
None
See application file for complete search history.

(56) References Cited

U.S. PATENT DOCUMENTS 4,816,123 A *  3/1989  Ogan ............... G01N 27/44756
                                                   204/601
6,210,972 B1 *  4/2001  Williams ........... G01N 15/1031
                                                   324/600
(Continued)

FOREIGN PATENT DOCUMENTS

JP         2003255017 A      9/2003

OTHER PUBLICATIONS

International Search Report in international application No. PCT/IB2015/056133, mailed on Nov. 19, 2015.
(Continued)

*Primary Examiner* — Jermele M Hollington
*Assistant Examiner* — Suresh K Rajaputra
(74) *Attorney, Agent, or Firm* — Oppedahl Patent Law Firm LLC

(57) ABSTRACT

A method and a system are shown for attachment of leads for the electrical sensing of the voltage on conductive structures; connections attached per this invention have the valuable property of very low thermoelectric errors (due to Seebeck effect), among several other beneficial properties. The described method can be applied in the factory setting as well as in the field. This system is especially suitable for applications with high-precision resistive shunts utilized in the measurements of the electric current.

29 Claims, 4 Drawing Sheets

(51) Int. Cl.
*G01R 31/00* (2006.01)
*G01R 11/02* (2006.01)

(56) References Cited

U.S. PATENT DOCUMENTS

| | | | | |
|---|---|---|---|---|
| 8,920,026 B2* | 12/2014 | Lazarov | ............ | G01R 19/0092 374/1 |
| 2007/0082531 A1* | 4/2007 | Higuchi | ............ | G01C 19/5719 439/304 |
| 2010/0201369 A1* | 8/2010 | Gronwald | ............ | G01R 1/203 324/430 |
| 2011/0212642 A1* | 9/2011 | Franke | ............ | H02K 11/33 439/326 |
| 2012/0028492 A1* | 2/2012 | Del Aguila Aguilar | ............ | H01R 4/4818 439/391 |
| 2012/0086430 A1* | 4/2012 | Marten | ............ | G01R 19/0092 324/76.11 |
| 2013/0009655 A1* | 1/2013 | Marten | ............ | G01R 1/203 324/713 |
| 2013/0328547 A1* | 12/2013 | Marten | ............ | G01R 1/203 324/126 |

OTHER PUBLICATIONS

Written Opinion of the International Searching Authority in international application No. PCT/IB2015/056133, mailed on Nov. 19, 2015.

* cited by examiner

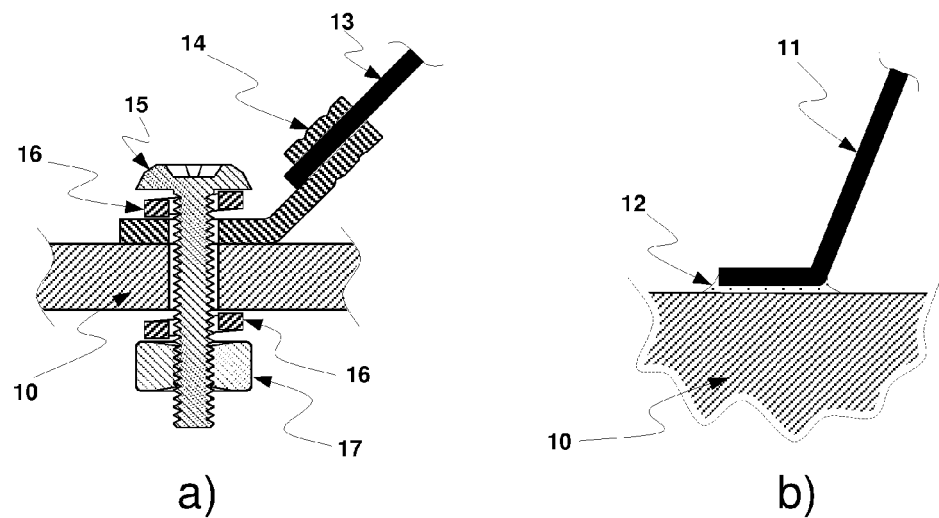
Figure 1 Previous Art
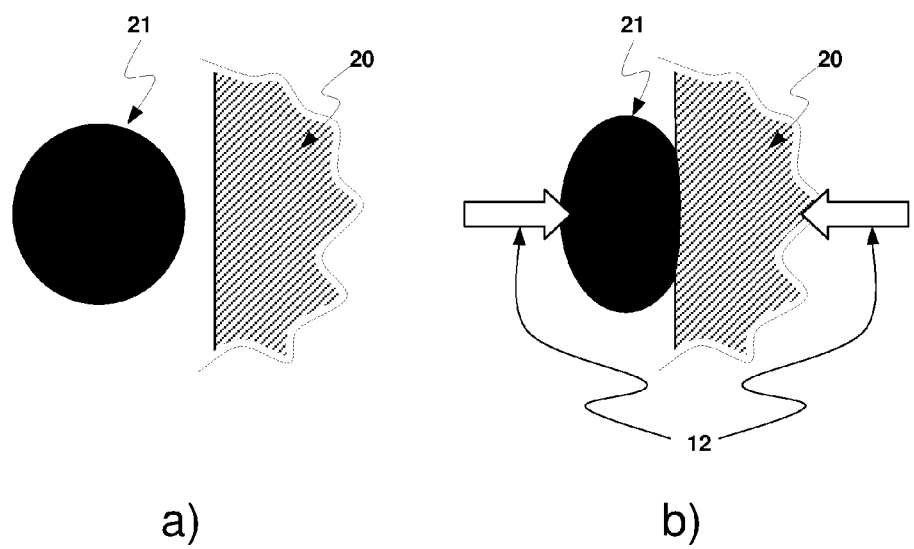
Figure 2

Cross-section B-B, magnified    Contact Area, magnified a)                               b)

ATTACHMENT OF LEADS HAVING LOW THERMOELECTRIC ERRORS

BACKGROUND

It is important to be able to measure electric current accurately. Applications for which accurate current measurement is important include:

- by utility companies delivering electric energy to customers;
- for control of industrial processes, such as electroplating and electrolytic manufacture of copper and other metals;
- for proper functioning of alternative-energy generators, such as wind and photovoltaic; and
- for estimation of state of charge in batteries for off-grid storage, electric vehicles, cell phones, portable computers, and in myriad other electrically powered devices.

Most of these applications require precise knowledge of the current over a wide dynamic range. In a current measurement device that works over a wide dynamic range, it is not easy to find a way to keep the measurement errors small at times when the current is near zero.

Of the several direct and indirect techniques that exist for measurements of current, the two most popular are the voltage drop sensing on a resistor due to Ohm's law (such a resistor is often called shunt, current shunt, or resistive shunt), and devices based on sensing of the magnetic field generated by the current. Each of these approaches for current measurement has advantages and disadvantages. Devices based on magnetic field detection are vulnerable to any nearby magnetic fields as well as to the magnetic field of the Earth. Current measurement by means of a resistive shunt is, by comparison, simple, robust, and as a rule less expensive, but a resistive shunt is prone to thermoelectric errors due to the so-called Seebeck effect, a physical phenomenon that results in generation of error voltages in the measurement circuit when a part of the circuit has a different temperature than another part of the circuit. Any shunt by definition has non-zero resistance and thus when current is flowing it heats up due to so-called ohmic losses. The ohmic losses, together with other possible nearby heat sources or sinks, give rise to temperature differentials that in turn cause thermoelectric errors.

For generation of thermoelectric errors, it is not enough that a part of the circuit has a different temperature than another part of the circuit. There must in addition be dissimilar materials in various parts of the circuit. In a current measurement device employing a resistive shunt, a typical source of dissimilar materials is the choice of materials for the shunt itself and for its sensing leads.

For example, in the commonly-used prior-art approach shown in FIG. 1a, the sensing lead wire 13 for the shunt is attached using bolt 15 and nut 17, as well as lock washers 16, and o-ring crimp terminal 14 that is connected to the sense lead 13 by the crimp (compression) operation on the terminal 14. Such a scheme juxtaposes many non-identical materials in series and parallel relationships relative to the signal path. This gives rise to a variety of thermoelectric voltages when the shunt heats up.

A prior-art arrangement in FIG. 1b depicts the attachment of a lead 11 using soldering, brazing, or welding. One problem with soldering or brazing (and with some kinds of welding) is that the solder or filler material 12 will present a non-identical material and thus will present an opportunity for thermoelectric voltages. While the amount of solder or filler material 12 between and thereabout the lead 11 and the conductive structure 10 can be reduced, it cannot be eliminated completely.

A further drawback to the use of soldering, brazing, or welding to attach a lead may be seen when one appreciates that the shunt will have been carefully processed prior to the attachment activity, and will likely have been thermally treated or annealed prior to the attachment activity. The application of significant heat (for the soldering, brazing, or welding activity) risks upsetting characteristics of the shunt that were the object of the thermal treatment or annealing. For example there may be a degradation of the thermal stability of the resistivity of the shunt in the areas affected by the heating activity.

Both of these prior-art arrangements also suffer from a rigid attachment of a lead to a shunt. In FIG. 1a the wire 13 is rigidly attached to the terminal 14 (at the crimp point). In FIG. 1b the lead 11 is rigidly attached to the structure 10. A rigid attachment creates a place where mechanical stresses are concentrated, leading to a possible rupture of the wire or lead at the point of rigid attachment. It is possible to apply an external stress-relief component, either in the form of flexible tubing or a specifically engineered part, however this is cumbersome and incurs some cost.

SUMMARY

To avoid the drawbacks of the arrangements shown in FIGS. 1a and 1b, it might be considered simply to physically juxtapose a wire 21 and a structure 20 shown in FIG. 2a. To achieve a solid electrical connection between the wire 21 and conductive structure 20, the wire and its target conductive structure should be brought touching together, and sufficient force should be applied to the connection. A clamping force 12 shown in FIG. 2b may preferably be of such a magnitude that the wire 21 deforms slightly; such deformation aids in the creation of a firm electrical connection, due to "mashing" together of the micro-abrasions and defects on the surface of wire 21 and structure 20. In addition, a liquid- and gas-tight seal is effectively created in the area of the electrical contact, preventing possible oxidation and deterioration of this contact in the future.

The clamping force 12 should be applied continuously, and throughout any expansion/contraction cycles that arise due to temperature changes at and around of the wire 21 and conductive structure 20.

The resistance arising from the junction between the wire 21 and the structure 20 is in part a function of the area of contact therebetween. The heat losses in such a junction are proportional to the square of current passing therethrough and to the resistance thereof. It will be appreciated that in a well designed system the currents flowing in leads such as lead wire 21 will be relatively small, and so any resistive losses in the junction between the wire 21 and the structure 20 will be relatively unimportant, from which it follows that the surface area of the point of contact can be relatively small without introducing objectionable resistive losses arising therefrom.

The present invention discloses a method and a physical approach to maintain the clamping force just described, in a way that permits very accurate current measurement. A hole is formed in a shunt and a lead is inserted into the hole. A resilient non-electrically-conductive plug is inserted into the hole. The composition and structure and dimensions of the plug are selected to maintain the clamping force.

DESCRIPTION OF THE DRAWING

The present invention will be described with reference to a drawing, of which:

FIGS. 1a and 1b illustrate prior-art approaches;

FIGS. 2a and 2b depict necessary conditions for a solid electrical contact;

DETAILED DESCRIPTION

Figure 6:
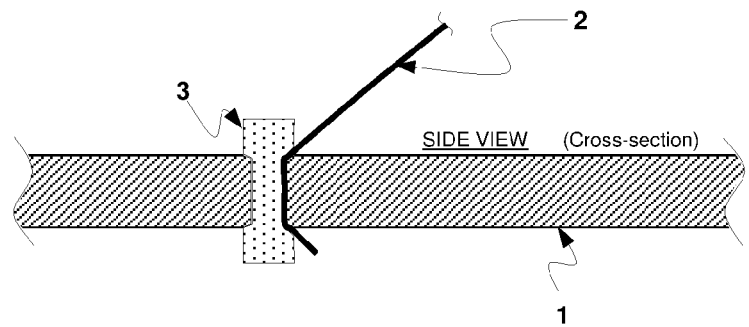
FIG. 6 demonstrates one completely assembled exemplary embodiment of the present invention.

Turning first to FIG. 6 we see a lead attachment arrangement according to the invention. A hole has been formed in the shunt or busbar 1, preferably having smoothed or rounded or chamfered edges at the top and bottom of the hole as shown in FIG. 6. A sensing lead 2 has been passed through the hole. A resilient plug 3 made of a non-conductive material has been inserted into the hole.

Turning back to FIGS. 3a through 3e, what is shown is a sequence of steps in the creation of the electrical contact according the present invention.

Figure 3:
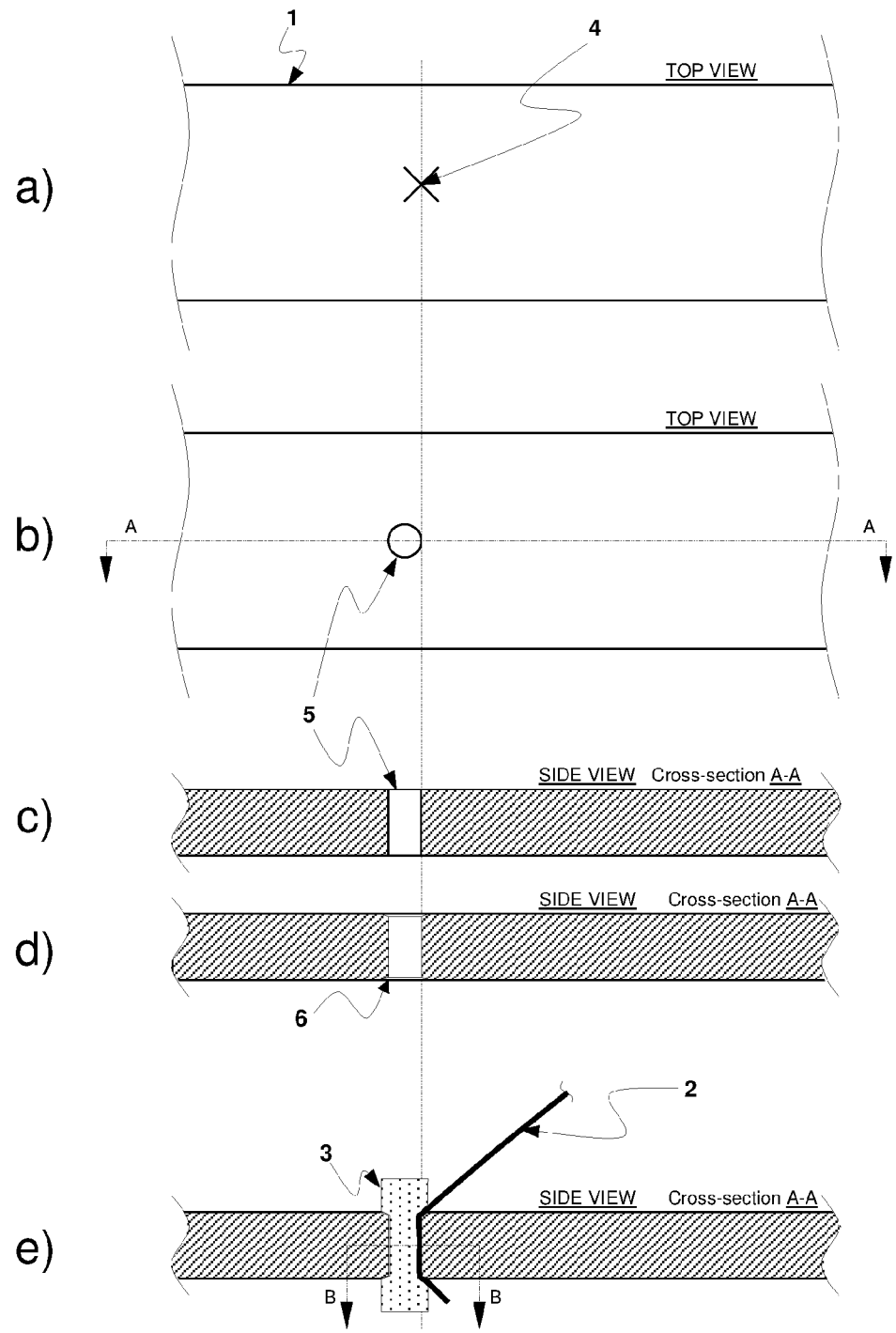
FIG. 3a through 3e explain the steps which may be carried out in creating an electrical connection according to the present invention.

First, as shown in FIG. 3a, a site 4 is selected where the contact is desired. Next, a hole 5 is machined or punched or drilled into the shunt or busbar 1 such that the side wall of the hole 5 is located at the desired contact site. The hole is seen in top view in FIG. 3b. FIGS. 3c, 3d, and 3e show the hole in cross section along section A-A denoted in FIG. 3b.

It will be appreciated that depending upon the particular manner in which the hole 5 is formed, there might be sharp imperfections or edges which, if permitted to persist, could result in deformation of the lead wire 2 to the point of breaking when the clamping force is applied. It will also be appreciated that it will be desirable to provide a less abrupt transition between the vertical wall of the hole 6 and the horizontal surface of the shunt or bus bar 1 in order to create a relatively large bending radius for the lead wire 2 as it passes over this corner. To these ends, preferably the hole 5 is chamfered or deburred so that the edges of the hole are to some extent rounded or smoothed, as shown in FIG. 3d.

As shown in FIG. 3e, a lead wire 2 is inserted into the hole 5, and an elastic non-conductive plug 3 is inserted into the hole 5. This creates the clamping force for the electrical contact between the lead wire 2 and shunt/busbar 1. This will remind the reader of the clamping force 12 shown in FIG. 2b.

It will thus be appreciated that this arrangement creates a junction between the lead wire 2 and shunt or bus bar 1 that does not have any extra conductive material therebetween. Such an extra conductive material therebetween, had it been present, would have risked generating Seebeck voltages. What's more, preferably the material of the lead wire 2 and of the shunt or busbar 1 is exactly the same, thus eliminating what would otherwise have been another possible source of Seebeck voltages. It will be appreciated that these ends are served by selecting the material of the plug 3 to be non-conductive.

It will be further appreciated that such an arrangement provides for some measure of cushioning of the lead wire 2 at its point of mechanical contact with the shunt or busbar 1, spreading any mechanical stress over some length of the lead wire 2, thus providing strain relief and robustness against vibrations.

Returning momentarily to FIG. 1a, it will be appreciated that many of the fastening elements in FIG. 1a, including the bolt 15 and the nut 17, rely on tensile strengths, and thus force the use of materials with high tensile strengths. Likewise the fastening element of crimp terminal 14 relies upon a persistent crimp connection due to swaging of material of the crimp connection, also calling for high tensile strength of portions of the material of the crimp connector. Returning momentarily to FIG. 1b, it will be appreciated that the connection point 12 is likewise required to be strong against separation, which calls for tensile strength of materials and surface junctions. Resilient and elastic materials such as plastics, with smaller tensile strengths than metals, are not well suited to the approaches of FIGS. 1a and 1b.

In contrast in the approach of FIG. 6, the plug 3 that is performing the role of a fastener relies on compressive strength rather than tensile strength. This permits the utilization of materials, such as non-conductive plastics, that traditional intuition would have ruled out from a robust mechanical design such as in FIG. 1a or 1b.

The resilience of the plug 3 provides for continuous application of the clamping force, even when the dimensions of the hole 6 and of the lead wire 2 change due to the changing temperature of the shunt/bus-bar 1. Stated differently, expansion and contraction of the rigid parts in FIG. 3e are not problematic, because the resilient plug 3 makes up the dimensional differences.

Figure 4:
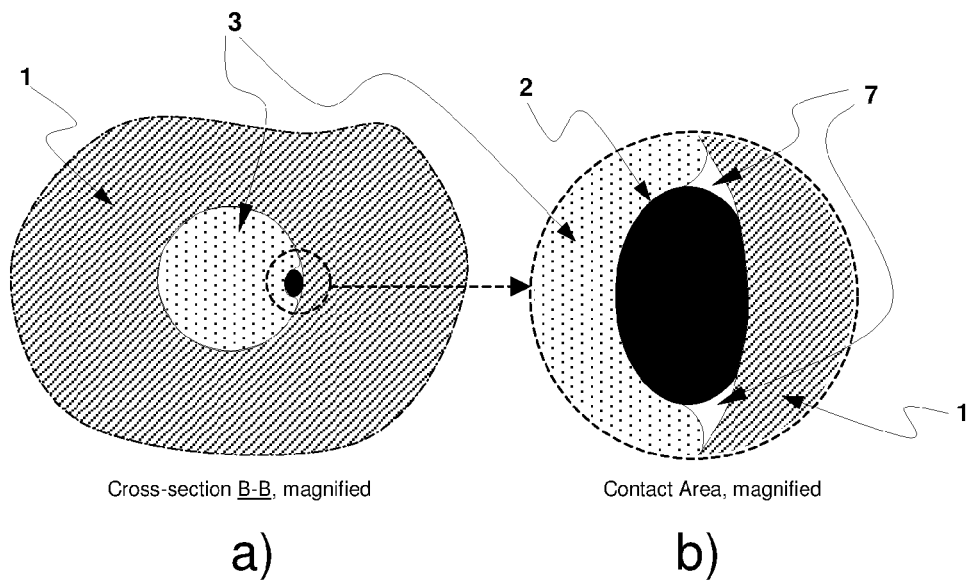
FIGS. 4a and 4b show magnified details of the contact according to the invention.

The modulus of elasticity for the material of plug 3 should desirably be selected with a view of providing sufficient force to slightly deform the lead wire 2, as shown in FIG. 4b, thus producing a gas- and liquid-tight connection, as well as increasing the contact surface, resulting in lower resistance of the contact.

An alert reader will notice, in FIG. 4b, that the sum of the plug 3 and the wire 2 does not totally fill the entire cross-section area of the hole. There are two slight openings (unfilled spaces 7) that will not be occupied by either the deforming plug 3 or by the wire 2. Depending on the required service conditions of this electrical connection, it may be preferable that these openings be filled with appropriate glue or filler, or liquid sealer is applied in such a way as to prevent the ingress of gases and/or liquids into the spaces 7. This will prevent oxidation or corrosion of the connection, and thus preventing what might otherwise be a possible increase of the resistance of the connection.

Figure 5:
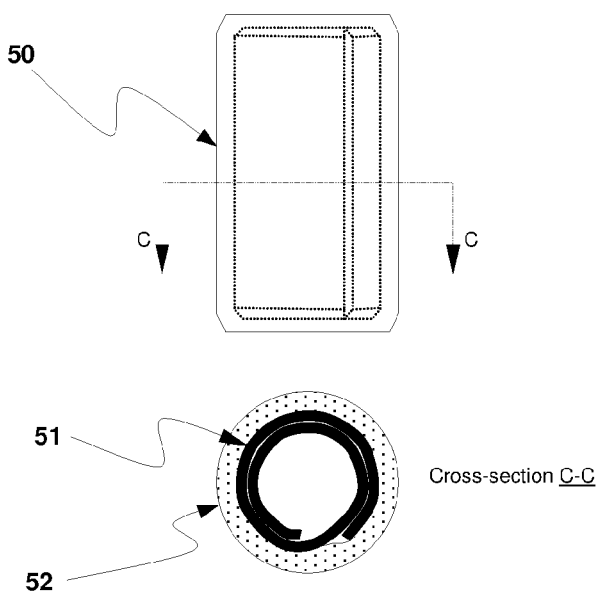
FIG. 5 discloses an alternative embodiment for one of the elements of the system.

An alternative embodiment for the creation of the elastic plug 50 is shown in FIG. 5. Such a construction allows the use of metal coil-spring 51 as the main element that undergoes mechanical deformation as the connection changes size due to temperature variations. The plug 50 nonetheless has electrical isolating properties due to non-conductive cover 52 that is applied over the spring pin 51. As compared with the simpler plug shown in FIG. 3e, the structure shown in FIG. 5 may offer higher values of clamping force as well as a more stable clamping force despite expansions and contractions due to temperature changes.

Modern engineered materials, for example fluoropolymers, may be used in the fabrication of plugs 3 (as in FIG. 3e) and covers 52 (as in FIG. 5), capable of operations well above 200° C.

What has been described above is the insertion of a single lead wire 2 through the hole before the placement of the resilient plug. It will be appreciated, however, that there can be applications where loss of the single lead wire 2 due to breakage would be undesirable. It will thus be appreciated that more than one lead wire 2 may be inserted into the connection before the placement of resilient plug. This permits provision of parallel and redundant electrical circuits which can provide higher system reliability.

The structures in FIGS. 3a to 3e will now be described using different terminology so as to correspond with the claims which follow. Returning to FIG. 3a, what is shown is an electrically conductive bulk mass 1, the bulk mass 1 having a first location 4 at which electrical potential is to be measured, the bulk mass 1 at the first location 4 at which electrical potential is to be measured composed of an electrically conductive material. Turning to FIGS. 3b and 3c, the bulk mass 1 defines a first hole 5 therethrough, the first hole 5 having a first edge at the first location 4 at which the electrical potential is to be measured. Also shown at FIG. 3e is a first lead 2 preferably composed of the same electrically conductive material of which the bulk mass 1 is composed at the first location 4 at which electrical potential is to be measured, the first lead 2 passing through the first hole 5 and in contact with the first edge at the first location 4 at which the electrical potential is to be measured. Also shown at FIG. 3e is a first resilient non-electrically-conductive plug 3 positioned within the hole 5, the first resilient non-electrically-conductive plug 3 sized to maintain force urging the first lead 2 toward the first edge at the first location 4 at which the electrical potential is to be measured.

Figure 7:
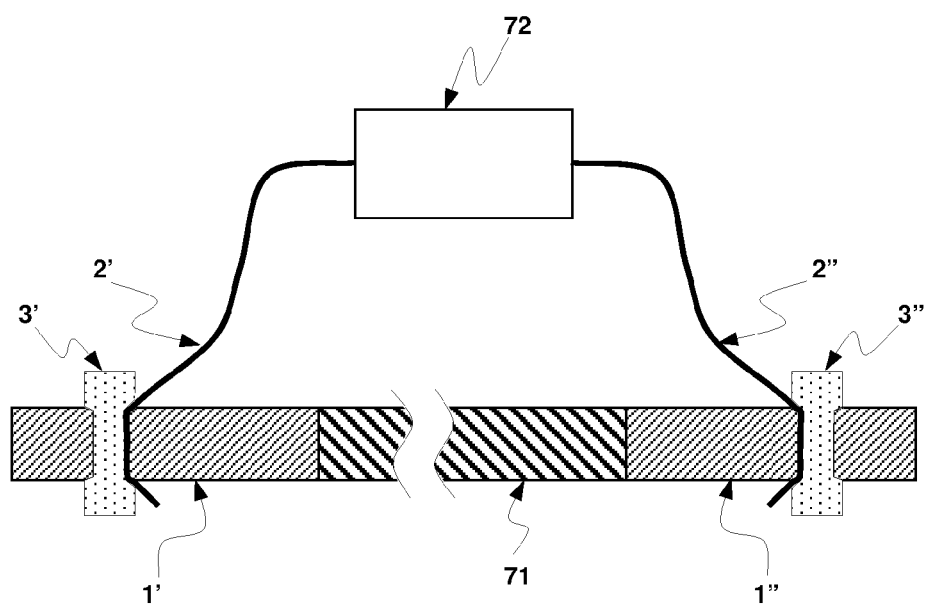
FIG. 7 shows a bulk mass which is composed of an electrically conductive material of lower conductivity.

Turning to FIG. 7, what may be seen is a bulk mass around 1' and lead 2' and resilient plug 3'. The bulk mass has a second location around 1" at which electrical potential is to be measured, the bulk mass at the second location at which electrical potential is to be measured composed of the same electrically conductive material of which the bulk mass is composed at the first location at which electrical potential is to be measured. A second lead 2" is preferably composed of the same electrically conductive material of which the bulk mass is composed at the second location around 1" at which the electrical potential is to be measured, the second lead passing through the second hole and in contact with the second edge at the second location at which the electrical potential is to be measured. A second resilient non-electrically-conductive plug 3" is positioned within the hole, the second resilient non-electrically-conductive plug sized to maintain force urging the second lead toward the second edge at the second location at which the electrical potential is to be measured.

Voltage measurement circuitry 72 is connected with the first lead 2' and is connected with the second lead 2", whereby a potential difference between the first lead and the second lead may be measured.

As seen in FIG. 5, the resilient non-electrically-conductive plug comprises a metal spring 51 covered by a non-electrically-conductive cover 52.

Returning to FIG. 7, a portion 71 of the bulk mass located between the first location at which the electrical potential is to be measured (around 1') and the second location at which the electrical potential is to be measured (around 1") is composed of an electrically conductive material of lower conductivity than that of the bulk mass at the first location at which electrical potential is to be measured.

A person skilled in the art will have no difficulties in devising myriad of applications utilizing the electrical connections made per the present invention, including but not limited to, distribution of electrical power, wiring and cabling.

The invention claimed is:

1. An electrical potential measurement apparatus comprising:
    an electrically conductive bulk mass, the bulk mass having a first location at which electrical potential is to be measured, the bulk mass at the first location at which electrical potential is to be measured composed of an electrically conductive material;
    said bulk mass defining a first hole therethrough, the first hole having a first edge at the first location at which the electrical potential is to be measured;
    a first lead passing through the first hole and in contact with the first edge at the first location at which the electrical potential is to be measured;
    a first resilient non-electrically-conductive plug positioned within the hole, the first resilient non-electrically-conductive plug sized to maintain force urging the first lead toward the first edge at the first location at which the electrical potential is to be measured.

2. The electrical potential measurement apparatus of claim 1 wherein the first lead is composed of the same electrically conductive material of which the bulk mass is composed at the first location at which electrical potential is to be measured.

3. The electrical potential measurement apparatus of claim 1 further comprising a second lead composed of the same electrically conductive material of which the bulk mass is composed at the first location at which electrical potential is to be measured, the second lead passing through the first hole and held in place by the first resilient non-electrically-conductive plug positioned within the hole.

4. The electrical potential measurement apparatus of claim 1 wherein the bulk mass has a second location at which electrical potential is to be measured, the bulk mass at the second location at which electrical potential is to be measured composed of the same electrically conductive material of which the bulk mass is composed at the first location at which electrical potential is to be measured;
    said bulk mass defining a second hole therethrough, the second hole having a second edge at the second location at which the electrical potential is to be measured;
    a second lead passing through the second hole and in contact with the second edge at the second location at which the electrical potential is to be measured;
    a second resilient non-electrically-conductive plug positioned within the hole, the second resilient non-electrically-conductive plug sized to maintain force urging the second lead toward the second edge at the second location at which the electrical potential is to be measured.

5. The electrical potential measurement apparatus of claim 4 wherein the second lead is composed of the same electrically conductive material of which the bulk mass is composed at the second location at which the electrical potential is to be measured.

6. The electrical potential measurement apparatus of claim 4 further comprising voltage measurement circuitry connected with the first lead and connected with the second lead, whereby a potential difference between the first lead and the second lead is measured.

7. The electrical potential measurement apparatus of claim 1 wherein the electrically conductive material is copper.

8. The electrical potential measurement apparatus of claim 1 wherein the first resilient non-electrically-conductive plug comprises a metal spring covered by a non-electrically-conductive cover.

9. The electrical potential measurement apparatus of claim 8 wherein the non-electrically-conductive cover comprises a fluoropolymer.

10. The electrical potential measurement apparatus of claim 8 wherein the metal spring is a coil spring.

11. The electrical potential measurement apparatus of claim 1 wherein the bulk material, the first resilient non-electrically-conductive plug, and the first lead together define first and second slight openings on opposite sides of the first lead, the electrical potential measurement apparatus further comprising a glue, filler, or sealer filling said first and second slight openings.

12. The electrical potential measurement apparatus of claim 1 wherein the first resilient non-electrically-conductive plug comprises a fluoropolymer.

13. The electrical potential measurement apparatus of claim 4 wherein a portion of the bulk mass located between the first location at which the electrical potential is to be measured and the second location at which the electrical potential is to be measured is composed of an electrically conductive material of lower conductivity than that of the bulk mass at the first location at which electrical potential is to be measured.

14. The electrical potential measurement apparatus of claim 1 wherein the first hole is free from sharp imperfections at the edge at the first location at which the electrical potential is to be measured.

15. A method for use with an electrically conductive bulk mass, the bulk mass having a first location at which electrical potential is to be measured, the bulk mass at the first location at which electrical potential is to be measured composed of an electrically conductive material, and for use with a first lead; the method comprising:
   machining a first hole through said bulk mass, the first hole having a first edge at the first location at which the electrical potential is to be measured;
   inserting the first lead through the first hole in contact with the first edge at the first location at which the electrical potential is to be measured;
   positioning a first resilient non-electrically-conductive plug within the hole, the first resilient non-electrically-conductive plug sized to maintain force urging the first lead toward the first edge at the first location at which the electrical potential is to be measured.

16. The method of claim 15 wherein the first lead is composed of the same electrically conductive material of which the bulk mass is composed at the first location at which electrical potential is to be measured.

17. The method of claim 15 further comprising the step, carried out before the positioning step, of inserting a second lead through the first hole, the second lead composed of the same electrically conductive material of which the bulk mass is composed at the first location at which electrical potential is to be measured.

18. The method of claim 15 further comprising chamfering the first hole in order to remove any sharp imperfections at the edge at the first location at which the electrical potential is to be measured.

19. The method of claim 15 wherein the bulk mass has a second location at which electrical potential is to be measured, the bulk mass at the second location at which electrical potential is to be measured composed of the same electrically conductive material of which the bulk mass is composed at the first location at which electrical potential is to be measured, the method for use with a second lead; the method further comprising:
   machining a second hole through said bulk mass, the second hole having a second edge at the second location at which the electrical potential is to be measured;
   inserting the second lead through the second hole in contact with the second edge at the second location at which the electrical potential is to be measured;
   positioning a second resilient non-electrically-conductive plug within the hole, the second resilient non-electrically-conductive plug sized to maintain force urging the second lead toward the second edge at the second location at which the electrical potential is to be measured.

20. The method of claim 19 wherein the second lead is composed of the same electrically conductive material of which the bulk mass is composed at the second location at which the electrical potential is to be measured.

21. The method of claim 19 further comprising chamfering the second hole in order to remove any sharp imperfections at the edge at the second location at which the electrical potential is to be measured.

22. The method of claim 19 further comprising connecting voltage measurement circuitry with the first lead and connected with the second lead, whereby a potential difference between the first lead and the second lead may be measured.

23. The method of claim 15 wherein the electrically conductive material is copper.

24. The method of claim 15 wherein the first resilient non-electrically-conductive plug comprises a metal spring covered by a non-electrically-conductive cover.

25. The method of claim 24 wherein the non-electrically-conductive cover comprises a fluoropolymer.

26. The method of claim 24 wherein the metal spring is a coil spring.

27. The method of claim 15 wherein the bulk material, the first resilient non-electrically-conductive plug, and the first lead together define first and second slight openings on opposite sides of the first lead, the method further comprising filling said first and second slight openings with a glue, filler, or sealer.

28. The method of claim 15 wherein the first resilient non-electrically-conductive plug comprises a fluoropolymer.

29. The method of claim 19 wherein a portion of the bulk mass located between the first location at which the electrical potential is to be measured and the second location at which the electrical potential is to be measured is composed of an electrically conductive material of lower conductivity than that of the bulk mass at the first location at which electrical potential is to be measured.

* * * * *